United States Patent [19]
Otani et al.

[11] Patent Number: 5,101,546
[45] Date of Patent: Apr. 7, 1992

[54] APPARATUS FOR REMOVING PRINTED BOARD

[75] Inventors: Tamio Otani, Hadano; Kunio Saitoh, Yokohama; Hideo Sato, Kawasaki; Norio Michigami, Isehara; Yuzi Obara, Ebina, all of Japan

[73] Assignee: Hitachi Seiko Ltd., Japan

[21] Appl. No.: 620,059

[22] Filed: Nov. 30, 1990

[51] Int. Cl.$^5$ .................. B23P 19/00; B23P 19/02
[52] U.S. Cl. .................. 29/426.3; 29/426.4; 414/796.5; 414/796.6; 414/796.7
[58] Field of Search .......... 29/426.1, 426.2, 426.3, 29/426.4, 426.5; 414/796.5, 796.6, 797

[56] References Cited

U.S. PATENT DOCUMENTS

| | | | |
|---|---|---|---|
| 3,776,393 | 12/1973 | Bargstedt | 414/797 |
| 4,179,236 | 12/1979 | Jones | 414/796.5 |
| 4,806,071 | 2/1989 | Sartorio | 414/797 |
| 4,960,361 | 10/1990 | Melzer | 414/797 |

FOREIGN PATENT DOCUMENTS 23130  3/1981  Japan .................. 414/796.5

Primary Examiner—P. W. Echols
Attorney, Agent, or Firm—Evenson, Wands, Edwards, Lenahan & McKeown

[57] ABSTRACT

An apparatus for taking out printed circuit boards, comprises a pin extracting device for extracting a plurality of pins erectly provided on a workpiece including printed circuit boards and a lower plate both of which are laminated, a reversing device for reversing the workpiece, a lower plate discharging device for discharging the lower plate from the workpiece, and a printed circuit board recovering device for recovering the printed circuit boards. The apparatus is capable of automatically taking out the printed circuit boards from the workpiece discharged from a perforator.

7 Claims, 15 Drawing Sheets

APPARATUS FOR REMOVING PRINTED BOARD

BACKGROUND OF THE INVENTION

The present invention relates to an apparatus for automatically taking out printed circuit boards from a workpiece after the perforating of the workpiece.

Printed circuit boards are manufactured by a method comprising the steps of perforating, plating and then etching.

During the perforating step, a plurality of printed circuit boards, an upper plate and a lower plate (or a lower plate only) are laminated, fixed at the peripheral portions thereof by using a plurality of reference pins and a plurality of fixing pins (or an adhesive tapes) to form a workpiece which is then supplied to a perforator.

It is therefore necessary to take out the printed circuit boards from the aggregate workpiece discharged from the perforator when the printed circuit boards are sent to the plating process.

Since the task of taking out the printed circuit boards is generally manually carried out, the workability is poor, and the manual operation is an obstacle to the automation of the production line for printed circuit boards.

SUMMARY OF THE INVENTION

Considering the above-described situation, it is an object of the present invention to provide an aromatic apparatus for removing printed circuit boards which from a workpiece discharged from a perforator.

In order to achieve the above object, apparatus and other objects, an according to first aspect or embodiment of the present inventron comprises a pin extracting device for extracting a plurality of pins erect on a workpiece in which printed circuit boards and a lower plate are laminated, a reversor means for reversing the workpiece, a lower plate discharging apparatus for discharging the lower plate from the workpiece, and a printed circuit board recovering apparatus for recovering the printed circuit boards.

Another apparatus according to a second aspect or embodiment of the present invention comprises a pin extractor for extracting a plurality of pins provided erect on a workpiece in which an upper plate, printed circuit boards and a lower plate are laminated, an upper plate discharging apparatus for discharging the upper plate from the workpiece, a reversor means for reversing the workpiece from which the upper plate is discharged, a lower plate discharging apparatus for discharging the lower plate from the workpiece, and a printed circuit board recovering device for recovering the printed boards.

Still another apparatus according to the third embodiment of the invention comprises a pin extracting device for extracting a plurality of pins provided erect on a workpiece in which an upper plate, printed circuit boards and a lower plate are laminated, a tape separating device for separating tapes from the lower plate of the workpiece, the tapes being applied to a plurality of portions in the periphery of the workpiece so as to fix the workpiece, an upper plate discharging device for discharging the upper plate from the workpiece, a reversing means for reversing the workpiece from which the upper plate is discharged, a lower plate discharging apparatus for discharging the lower plate from the workpiece, and a printed circuit board recovering device for recovering the printed circuit boards.

In the first embodiment of the invention, a plurality of pins which are erected on the workpiece discharged from a perforator are extracted by the pin extracting device, the workpiece is then reversed by the reversing device so that the lower plate is discharged by the lower plate discharging device, and the printed circuit boards are then taken out by the printed circuit board recovering device.

In the second embodiment of the invention, a plurality of pins which are erected on the workpiece discharged from a perforator are extracted by the pin extracting device, the upper plate is discharged by the upper plate discharging device, the workpiece is then reversed by the reversing device so that the lower plate is discharged by the lower plate discharging device, and the printed circuit boards are then taken out by the printed circuit board recovering device.

In the third embodiment of the invention, a plurality of pins which are erected provided on the workpiece discharged from a perforator are extracted by the pin extracting device, the lower portion of each of the tapes applied to the workpiece is separated by the tape separating device, the upper plate to which the tapes remain applied is discharged by the upper plate discharging device, the workpiece is then reversed by the reversing device so that the lower plate is discharged by the lower plate discharging device, and the printed circuit boards are then taken out by the printed circuit board recovering device.

In this way, the printed circuit boards can be removed from the aggregate workpiece.

DETAILED DESCRIPTION OF PREFERRED EMBODIMENTS

Figure 3A:
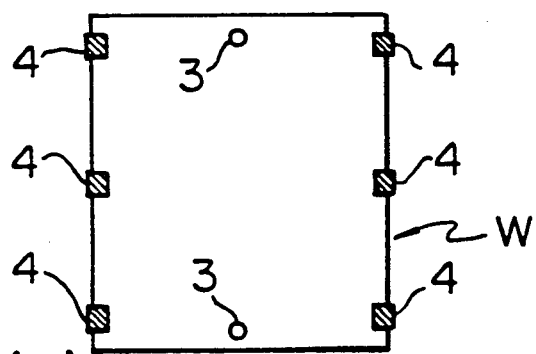
FIG. 3 is a plan view of an example of workpieces handled in the present invention with portion (a) being a plan view of the workpiece and portion (b) being an elevational view.
Figure 3B:
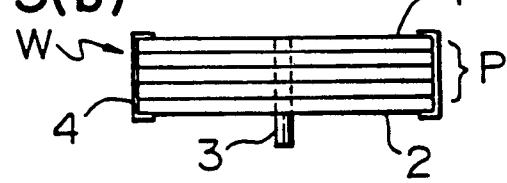
Figure 4:
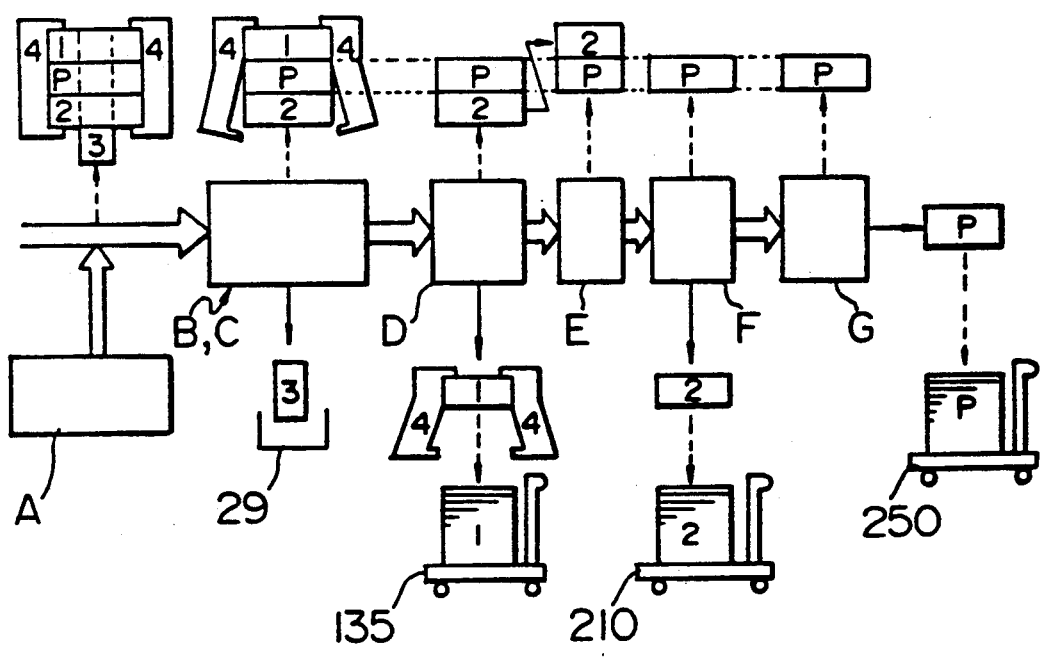
FIG. 4 illustrates the steps in the apparatus for taking out printed circuit boards in accordance with the present invention.

In the drawings, a workpiece W operated on by a perforator comprises a plurality of laminated printed circuit boards P and an upper plate 1 and a lower plate 2 (FIG. 3), both of which are respectively laminated on the upper and lower sides of the printed circuit boards P. Reference pins 3 are pressed into the workpiece W at predetermined positions at both ends in the lengthwise direction thereof so that the boards are integrally fixed, and tapes 4 are applied to both sides of the workpiece W, as also shown in FIG. 3.

Figure 1:
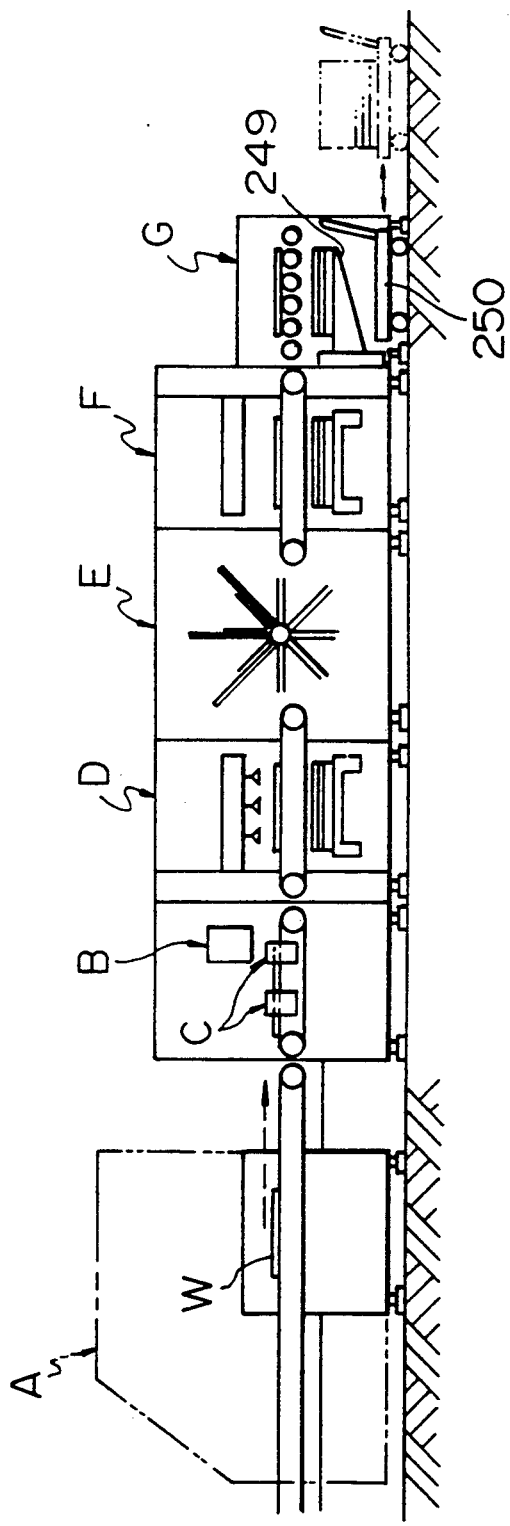
FIG. 1 is a front view of an apparatus for taking out printed circuit boards in accordance with the present invention.
Figure 2:
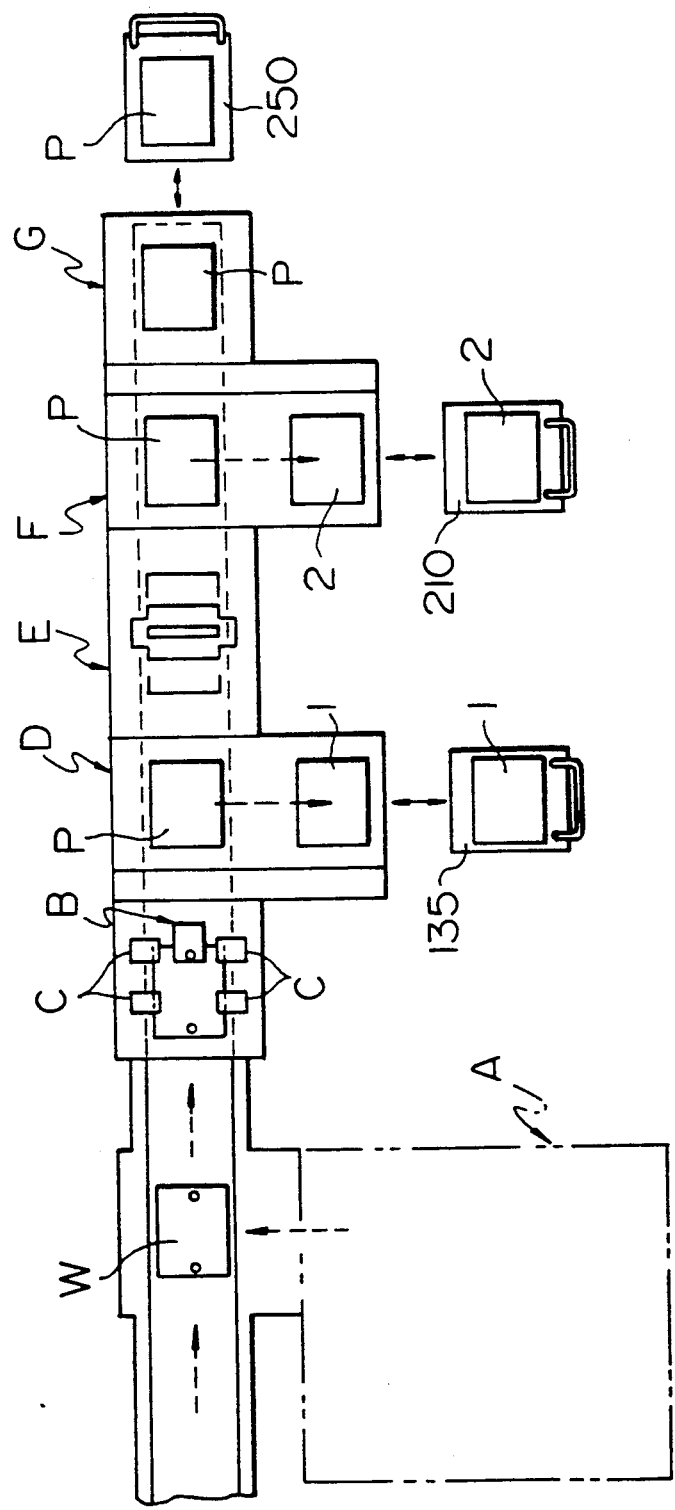
FIG. 2 is a plan view of the apparatus shown in FIG. 1.

As shown in FIGS. 1 and 2, an apparatus for taking out the printed circuit boards P comprises a pin extracting unit B which receives the workpiece W discharged from the perforator A for the printed circuit boards P and which extracts the reference pins 3 therefrom, a tape separating unit C for separating the tapes 4 applied to the workpiece W from the lower plate 2, an upper plate discharging unit D for discharging the upper plate 1 from the workpiece W from which the lower portions of the tapes 4 are separated, a reversing unit E for reversing the workpiece W from which the upper plate 1 is discharged, a lower plate discharging unit F for discharging the lower plate 2 from the workpiece W, and a printed circuit board recovering means G for taking out the remaining printed circuit boards P.

Figure 5:
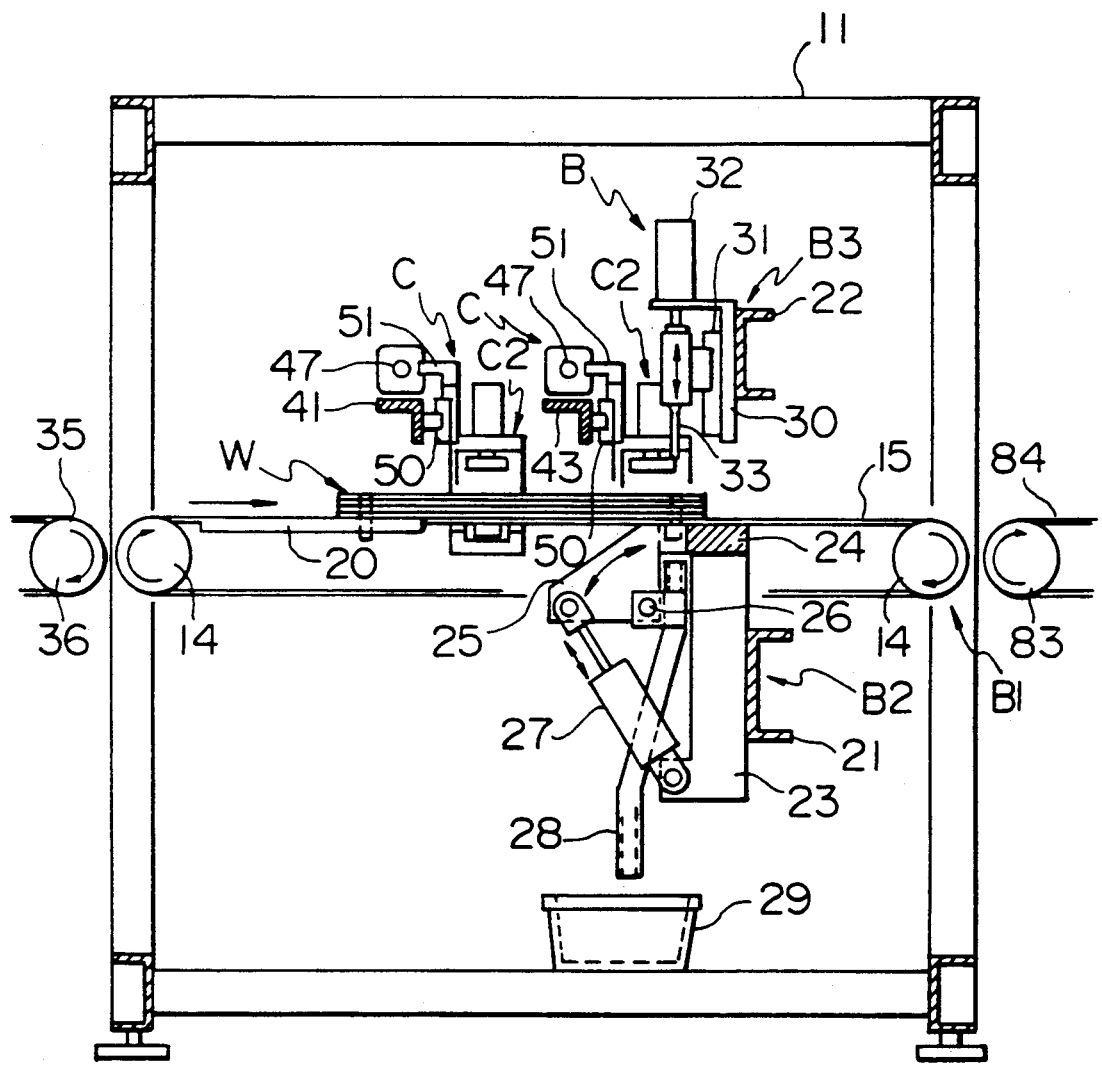
FIG. 5 is a front sectional view of a pin extracting device and a tape separating device.
Figure 6:
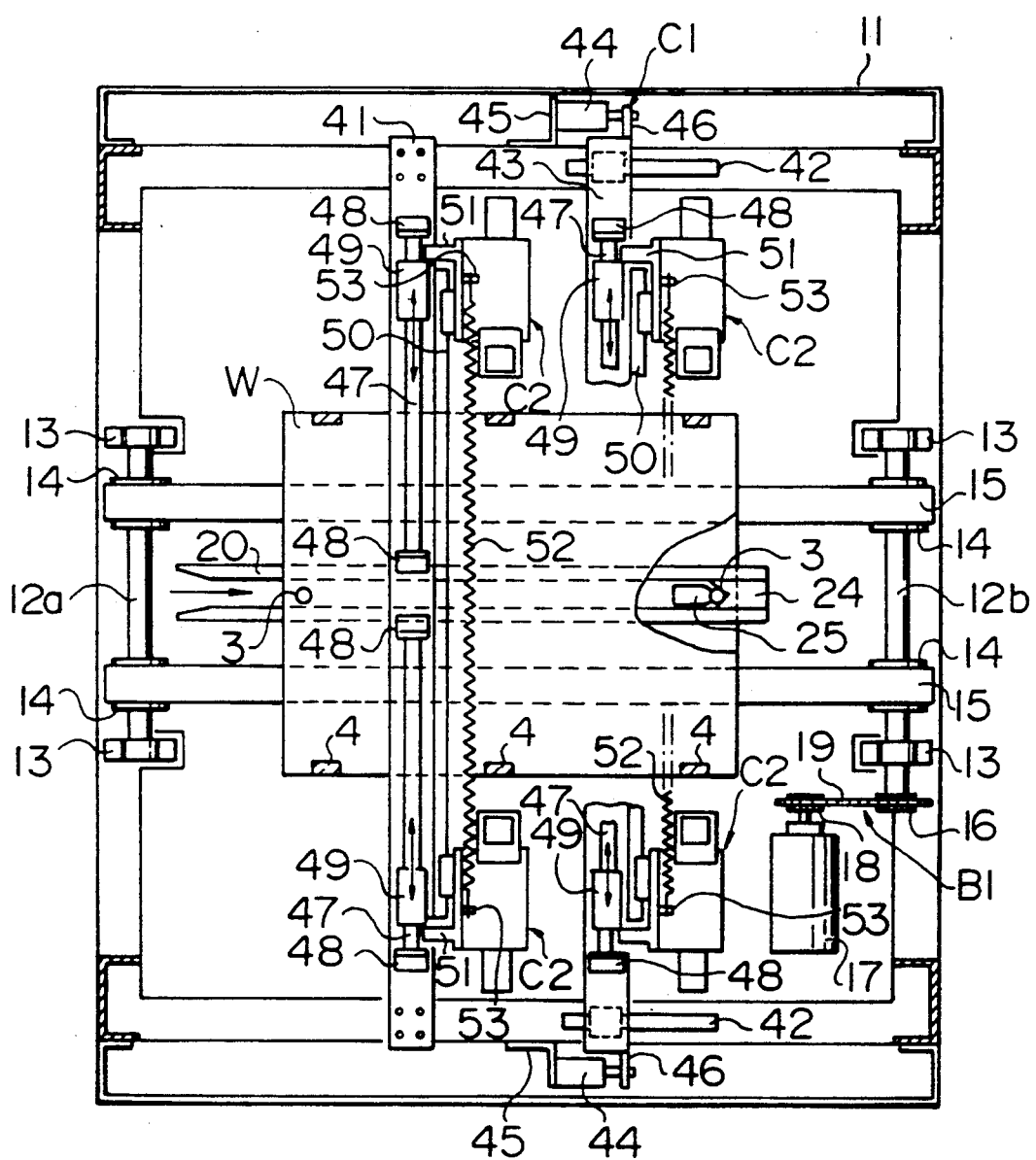
FIG. 6 is a plan view of the tape separating device.

The pin extracting unit or device B comprises a carriage unit B1 for carrying the workpiece W, a positioning unit B2 for positioning the workpiece W, and a pin extracting unit B3 for extracting the reference pins 3, as shown in FIGS. 5 and 6.

The carriage unit B1 is as shown in FIG. 6.

In the drawing, reference numeral 11 denotes a frame, and reference numerals 12a and 12b each denote a rotational shaft which is rotatably supported by bearings 13 fixed to the frame 11. Reference numeral denotes pulleys which are fixed to each of the rotational shafts 12a, 12b at predetermined distances. Reference numeral 15 denotes belts, each of which is placed over the pulleys 14. Reference numeral 16 denotes a sprocket fixed at one end of the rotational shaft 12b. Reference numeral 17 denotes a motor fixed to the frame 11. Reference numeral 18 denotes a sprocket fixed to the rotational shaft of the motor 17. Reference numeral 19 denotes a chain placed over the sprockets 16 and 18. Reference numeral 20 denotes a guide disposed in parallel with the belts 15 at predetermined distances.

In this arrangement, when the motor 17 is operated, the rotational shaft 12b is rotated through the sprocket 18, the chain 19 and the sprocket 16 so as to drive the belts 15. When the workpiece W is sent onto the belts 15, the workpiece W is conveyed in the running direction of the belts 15. At the same time, the reference pins 3 of the workpiece W are moved along the guide 20.

The positioning unit B2 is as shown in FIG. 5.

In the drawing, reference numeral 21 denotes a beam which is fixed to the frame 11 so as to be disposed under the belts 15. Reference numeral 23 denotes a base fixed to the beam 21. Reference numeral 24 denotes a block which has a V-shaped groove (as seen in FIG. 6) and which is fixed to the base 23 so as to project into the passage of the reference pins 3 of the workpiece W carried by the belts 15. Reference numeral 25 denotes a clamper which is rotatably supported by the base 23 through a pin 26 so as to position the reference pins 3 between the clamper 25 and the block 24. Reference numeral 27 denotes a cylinder which is rotatably connected between the base 23 and the clamper 25.

In this arrangement, when the reference pins 3 of the workpiece W carried by the belts 15 contact the V-shaped groove of the block 24, the cylinder 27 is operated so as to rotate the clamper 25. As a result, the clamper 25 pushes the reference pins 3 against the block 24 so as to position the reference pins 3.

Reference numeral 28 denotes a pipe which is fixed to the base 23 so as to be disposed under the V-shaped groove of the block 24. Reference numeral 29 denotes a container box disposed under the pipe 28.

The reference pins 3 extracted from the workpiece W are guided by the pipe 28 and recovered in the container box 29.

The pin extracting unit B3 is as shown in FIG. 5.

In the drawing, reference numeral 22 denotes a beam fixed to the frame 11 so as to be placed above the belts 15. Reference numeral 30 denotes a bracket fixed to the beam 22. Reference numeral 31 denotes a guide apparatus supported by the bracket 30. Reference numeral 32 denotes a cylinder supported by the bracket 30. Reference numeral 33 denotes a pin extracting rod supported by the movable member of the guide apparatus 31.

In this arrangement, after the reference pins 3 of the workpiece W have been completely positioned by the positioning unit B2, the cylinder 32 is operated so as to downwardly move the rod 33 which thus extrudes the reference pins 3 from the workpiece W.

Reference numeral 35 denotes a conveyor for conveying the workpiece W. The conveyor 35 is placed over the pulleys 36 and is driven by a driving source (not shown).

The tape separating unit C comprises a moving unit C1 and a tape separating unit C2, as shown in FIGS. 5 to 8.

The moving unit C1 is shown in FIG. 6.

In the drawing, reference numeral 41 denotes a beam fixed to the frame 11; reference numeral 42 being a guide fixed to the frame 11 in parallel with the direction of conveyance of the workpiece W; reference numeral 43 being a moving beam supported by the movable member of the guide 42; and reference numeral 44 being a cylinder fixed to the frame 11 through a bracket 45. The movable member of the cylinder 44 is connected to the movable beam 43 through a bracket 46. Reference numeral 47 denotes rodless-type cylinders which are respectively supported by the beam 41 and the moving beam 43 through the brackets 48; reference numeral 49 denotes the slider of each of the cylinders 47; reference numeral 50 denotes guides which are respectively provided on the beam 41 and the moving beam 43; reference numeral 51 denotes sliders which are respectively supported by the moving members of the guides means 50 so that one end of each slider 51 projects into the movement passage of the slider 47; and reference numeral 52 denote springs which are respectively placed over the pins 53 provided erect on or projecting from the sliders 51.

In this arrangement, when the cylinders are operated, the moving beams 43 are respectively moved along the guides 42. When the cylinders 47 are operated, the tape separating unit C2 is moved along the guides 50.

Figure 7:
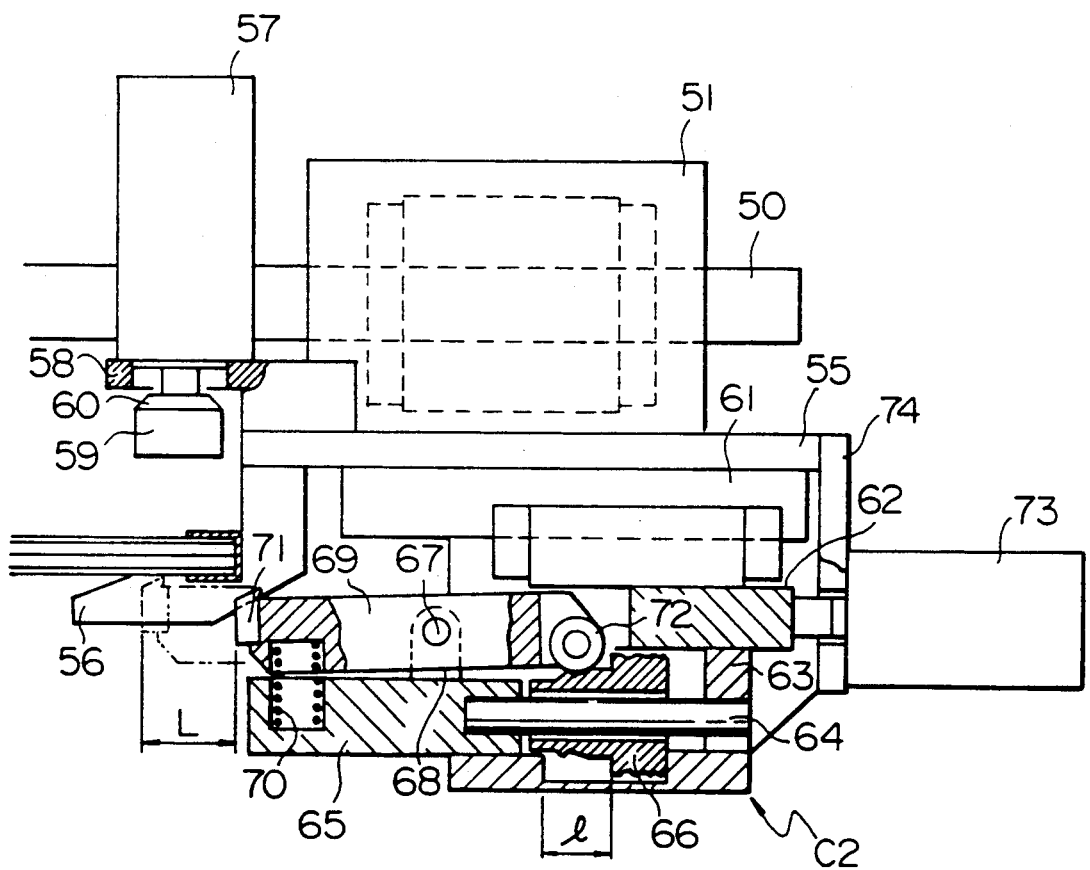
FIG. 7 is a side view of a tape separating unit.
Figure 8:
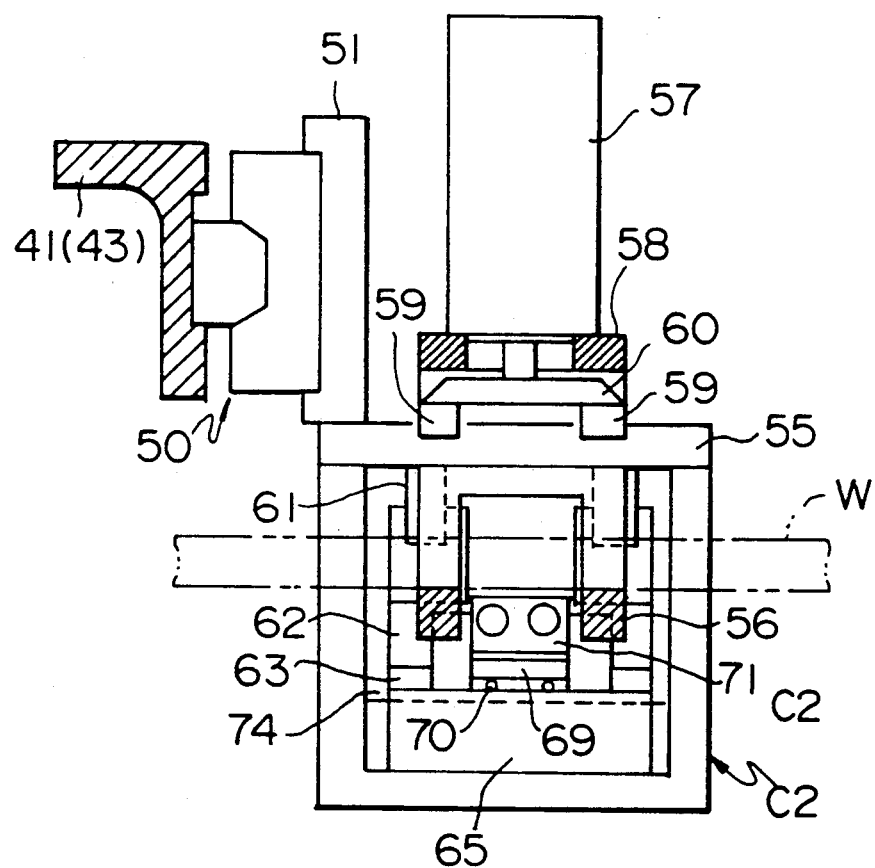
FIG. 8 is a front sectional view of the tape separating unit shown in FIG. 7.

The tape separating unit C2 is supported by the slider 51, as shown in FIGS. 7 and 8.

In the drawings, reference numeral 55 denotes a frame fixed to the slider 51; reference numeral 56 denotes a supporting arm fixed to the end of the frame 55 on the workpiece side thereof; reference numeral 57 denotes a cylinder which is provided at the end of the frame 55 on the workpiece side thereof through a bracket 58 so as to be opposite to the supporting arm 56; reference numeral 59 denotes a rubber clamp which is supported by the movable member of the cylinder 57 through a plate 60 so as to be opposite to the supporting arm 56; reference numeral 61 denotes a guide supported by the frame 55; reference numeral 62 denotes a slider supported by the movable member of the guide 61; reference numeral 63 denotes a bracket fixed to the slider 62; reference numeral 64 being a coupling rod fixed to the bracket 63; reference numeral 65 denotes a slider connected to the bracket 63 through the coupling rod 64; reference numeral 66 denotes a cam movably supported by the coupling rod 64; reference numeral 67 denotes a supporting shaft supported by the slider 65 through a bracket 68; reference numeral 69 denotes a rocking arm supported by the supporting shaft 67 so that it can rock; reference numeral 70 denotes a spring mounted between the slider 65 and the end of the rocking arm 69 on the workpiece side thereof; reference number 71 denotes a knife fixed to the end surface of the rocking arm 69 on the workpiece side thereof; reference numeral 72 denotes a roller which is rotatably supported at the rear end of the rocking arm 69 and which contacts the cam 66 by virtue of pressure against the spring 70; and reference numeral 73 denotes a cylinder fixed to the frame 55 through the bracket 74. The movable member of the cylinder 73 is connected to the slider 62.

In this arrangement, when the cylinder 73 is operated so as to move the slider 62 toward the workpiece side, the slider 65, the cam 66 and the rocking arm 69 are also moved toward the workpiece side. When the cam 66 is moved for a distance l, it is stopped by contact with the end surface of the groove of the frame 55. At this time, since the slider 65 and the rocking arm 69 are further moved, the position of engagement between the roller 72 and the cam 66, and the end of the rocking arm 69 on the workpiece side thereof is pushed upwardly by the spring 70 so that the knife 71 is pushed on the lower plate 2 of the workpiece W.

When the knife 71 is moved for a distance L, the operating direction of the cylinder 73 is removed. As a result, the slider 65 and the rocking arm 69 are moved toward the cylinder side, and the knife 71 rubs on the lower plate 2 so as to separate the tapes 4 from the lower plate 2. At the same time, the cam 66 is moved toward the cylinder side while being pushed by the roller 72. When the cam 66 is moved for the distance (, it is stopped by contact with the end surface of the groove of the frame 55. When the slider 65 and the rocking arm 69 are further moved toward the cylinder side 73, the position of engagement between the roller 73 and the cam 66 is shifted, and the rocking arm 69 rocks against the opposing pressure of the spring 70 so that the knife 71 is moved to a position where the knife does not contact the lower plate 2.

This operation is repeated one or more times so that the tapes 4 are separated from the lower plate 2.

Figure 9:
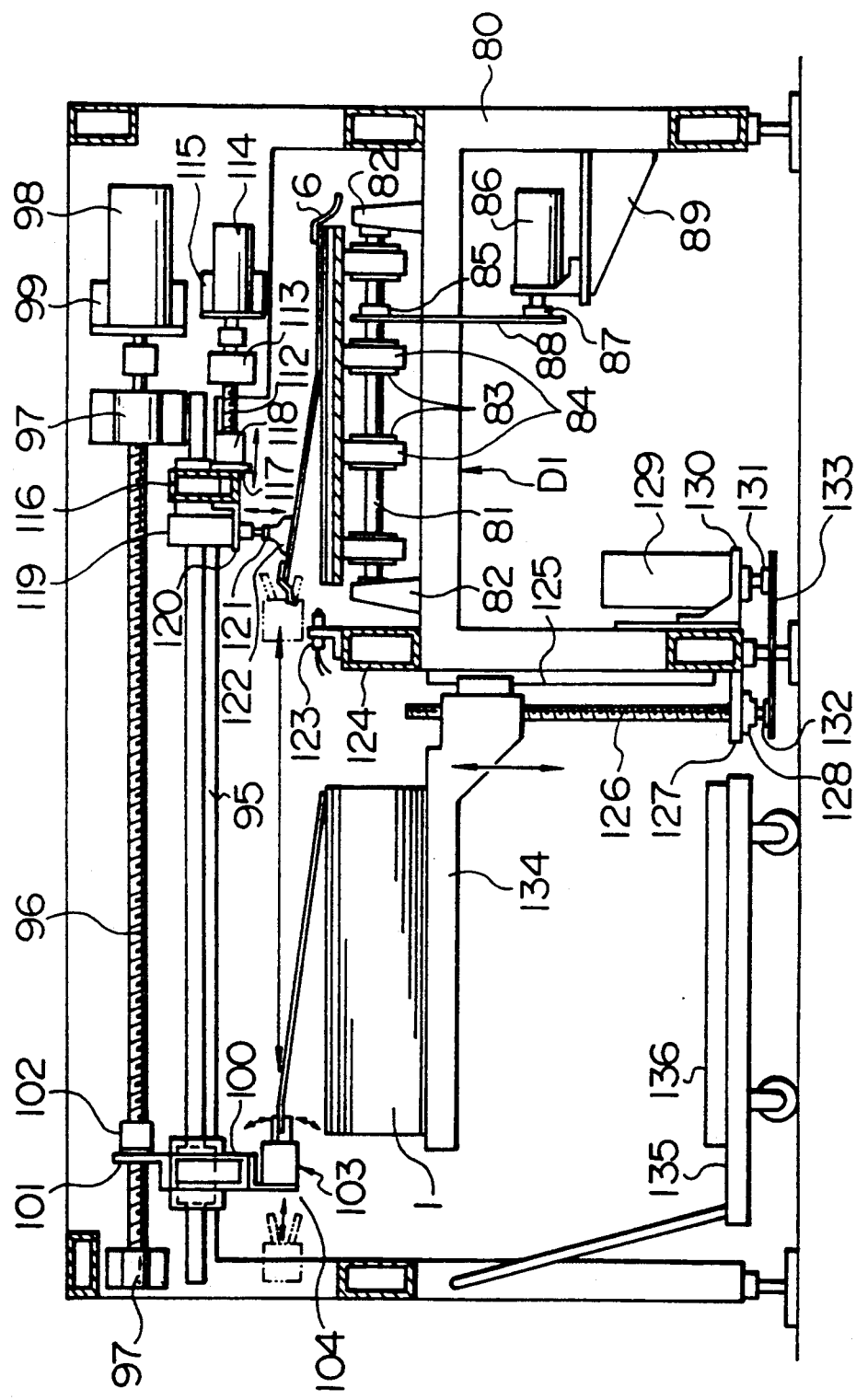
FIG. 9 is a side sectional view of an upper plate discharging apapratus.
Figure 10:
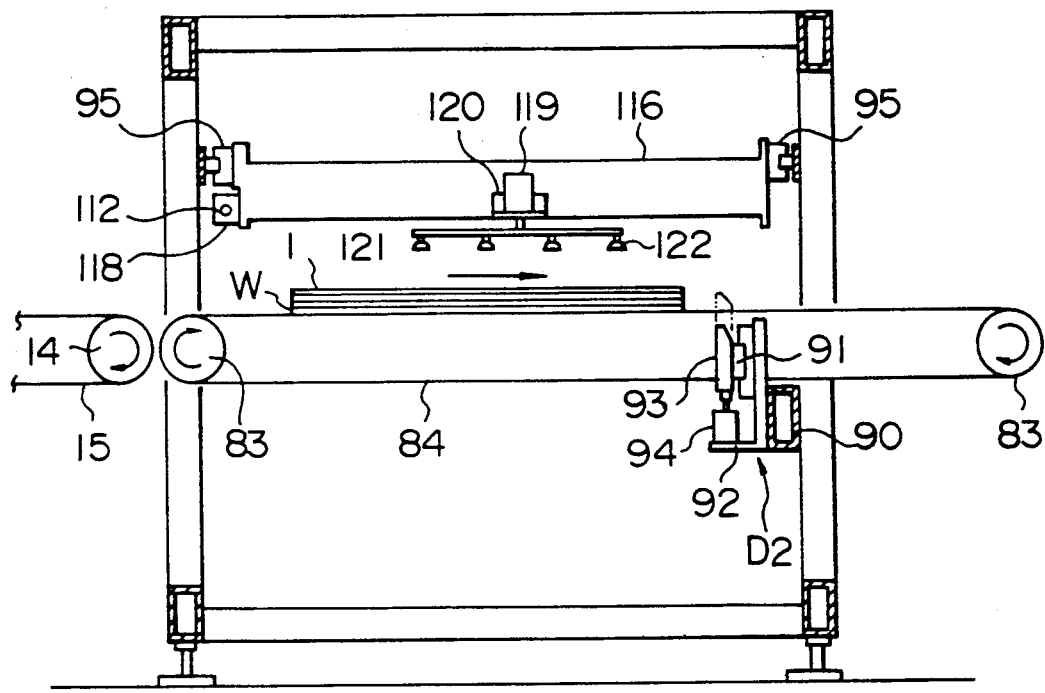
FIG. 10 is a front sectional view of the apparatus shown in FIG. 9.

The upper plate discharging unit D comprises a carriage unit D1 for carrying the workpiece W, a stop unit D2 for stopping the workpiece W at a predetermined position, and a discharge unit D3 for discharging the upper plate 1, as shown in FIGS. 9 and 10.

The carriage unit D1 is shown in FIG. 9.

In the drawing, reference numeral 80 denotes a frame; reference numeral 81 denotes a rotational shaft rotatably supported by the frame 80 through bearings 82; reference numeral 83 denotes pulleys fixed to the rotational shaft 81 reference numeral 84 denotes belts respectively placed over the pulleys 83; reference numeral 85 denotes a sprocket fixed to the rotational shaft 81; reference numeral 86 denotes a motor supported by the frame 80 through a bracket 89; reference numeral 87 denotes a sprocket fixed to the rotational shaft of the motor 86; and reference numeral 88 denotes a chain placed over the sprockets 85 and 87.

In this arrangement, when the motor 86 is operated, the rotational shaft 81 is rotated through the sprocket 87, the chain 88 and the sprocket 85 so as to drive the belts 84. When the workpiece W is sent onto the belts 84, the workpiece W is carried in the running direction of the belts 84.

The stop unit D2 is shown in FIG. 10.

In the drawing, reference numeral 90 denotes a beam fixed to the frame 80; reference numeral 91 denotes a guide supported by the beam 90 through a bracket 92; reference numeral 93 denotes a stopper fixed by the movable member of the guide 91; and reference numeral 94 denotes a cylinder fixed by the bracket 92. The movable member of the cylinder 94 is connected to the stopper 93.

In this arrangement, often the reference pins 3 are extracted, and when the workpiece W, in which the tapes 4 have been separated from the lower plate 2, is sent to the carriage unit D1 from the carriage unit B1, the cylinder 94 is operated so that the stopper 93 is projected into the carriage passage of the workpiece W. When the workpiece W is stopped by contact with the stopper 93 and when the belts 84 are stopped, the cylinder 94 is again operated so that the stopper 93 is retracted from the carriage passage of the workpiece W.

The discharge unit D3 is shown in FIG. 9.

In the drawing, reference numeral 95 denotes a guide supported by the frame 80 in a direction vertical with respect to the carriage direction of the workpiece W; reference numeral 96 denotes a feed screw rotatably supported by the frame 80 through bearings 97; reference numeral 98 denotes a motor fixed to the frame 80 through a bracket 99, the rotational shaft of the motor 98 being connected to the feed screw 96; reference numeral 100 denotes a movable beam fixed to the movable member of the guide 95 and connected to a nut 102 which engages with the feed screw 96,.through a bracket 101; and reference numeral 103 denotes a chuck supported by the movable beam 100 through a bracket 104.

Figure 11:
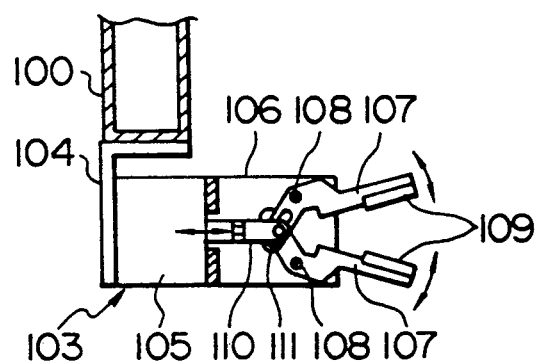
FIG. 11 is a partially sectional side view of a chuck in the upper plate discharging means.

The chuck 103 is shown in FIG. 11.

In the same drawing, reference numeral 105 denotes a cylinder fixed to a bracket 104; reference numeral 106 denotes a bracket fixed to the cylinder 105; reference numeral 107 denotes fingers rotatably supported by the bracket 106 through pins 108; reference numeral 109 denotes a chip fixed to the opposite surfaces of the fingers 107; and reference numeral 110 being a joint fixed to the movable member of the cylinder 105 and connected to the fingers by a pin 111.

In this arrangement, when the cylinder 105 is operated so as to move the joint 110 toward the cylinder 105, the fingers 107 are closed, while when the joint 110 is moved in the direction opposite to the cylinder 105, the fingers 107 are opened. In this way, an object e.g. (the upper plate 1) can be held and released by closing and opening the fingers 107.

Reference numeral 112 denotes a feed screw rotatably supported by a bearing 113; reference numeral 114 denotes a motor fixed to the frame 80 through a bracket 115, the rotational shaft of the motor 114 being connected to the feed screw 112; reference numeral 116 denotes a movable beam fixed to the movable member of the guide denotes 95 and connected to a nut 118 which engages with the feed screw 112, through a bracket 117; reference numeral 119 denotes a cylinder fixed to the movable beam 116 through a bracket 120; reference numeral 121 denotes a holder fixed to the movable member of the cylinder 119; and reference numeral 122 denotes a suction pad fixed to the holder 121 and connected to a vacuum supply source through a change-over valve (not shown).

In this arrangement, when the workpiece W is stopped at a predetermined position, the cylinder 119 is operated so as to downwardly move the suction pad 122 and push the suction pad 122 on the upper plate 1. In this state, when the cylinder 119 is operated in the reversed direction so as to upwardly move the suction pad 122, the upper plate 1 is separated from the printed circuit boards P. When the motor 114 is then operated so as to rotate the feed screw 112 and move the suction pad 122 to a predetermined position, the upper plate 1 is inserted into the fingers 107 of the chuck 103 which waits at a delivery position. The chuck 103 is then operated to hold the upper plate 1. At the same time, the inside of the suction pad 122 is made to communicate with the atmosphere so that the upper plate 1 is released from the suction pad 122. The motor 114 is then operated so as to reverse the feed screw 112, whereby the suction pad 122 is returned to the stand-by position.

The motor 98 is operated so as to rotate the feed screw 96 and move the chuck 103 to the position where the upper plate 1 is discharged. When the chuck 103 is opened so as to release the upper plate 1 at the discharge position, the motor 98 is rotated in the reversed direction so as to reverse the feed screw 96 and move the chuck 103 to the position where the upper plate 1 is delivered. The chuck 103 waits for the discharge of the next upper plate.

Reference numeral 123 denotes a nozzle connected to a compressed air source fixed to the frame 80 through a bracket 124. The nozzle 123 is positioned so as to be opposite to the position in the workpiece W where the printed circuit boards P and the upper plate 1 are laminated.

When the suction pad 122 raises the upper plate 1, compressed air is blown out of the nozzle 123 toward the portion between the upper plate 1 and the printed circuit boards P so as to separate the upper plate 1 from the printed circuit boards P.

Reference numeral 125 denotes a guide member fixed to the rame 80; reference numeral 126 denotes feed screw rotatably supported by a bearing 128, which is fixed to the frame 80 through a bracket 127; reference number 129 denotes a motor fixed to the frame 80 through a bracket 130; a reference numbrr 131 denotes a sprocket fixed to the rotational shaft of the motor 129; reference numeral 132 denotes a sprocket fixed to one end of the feed screw 126; reference numeral 133 denotes a chain placed over the sprockets 131 and 132; reference numeral 134 denotes a lifter having a nut which engages with feed screw 126 and fixed to the movable member of the guide member 125; and reference numeral 135 denotes a truck to which an upper plate cradle 136 is fixed.

In this arrangement, when the motor 129 is operated, the feed screw 126 is rotated through the sprocket 131, the chain 133 and the sprocket 132 so that the lifter can be vertically moved. The lifter 134 is thus moved in correspondence with the number of the upper plates 1 discharged. When the lifter 134 reaches the lower end of movement, the upper plates 1 on the lifter 134 are transferred to the truck 135.

Figure 12:
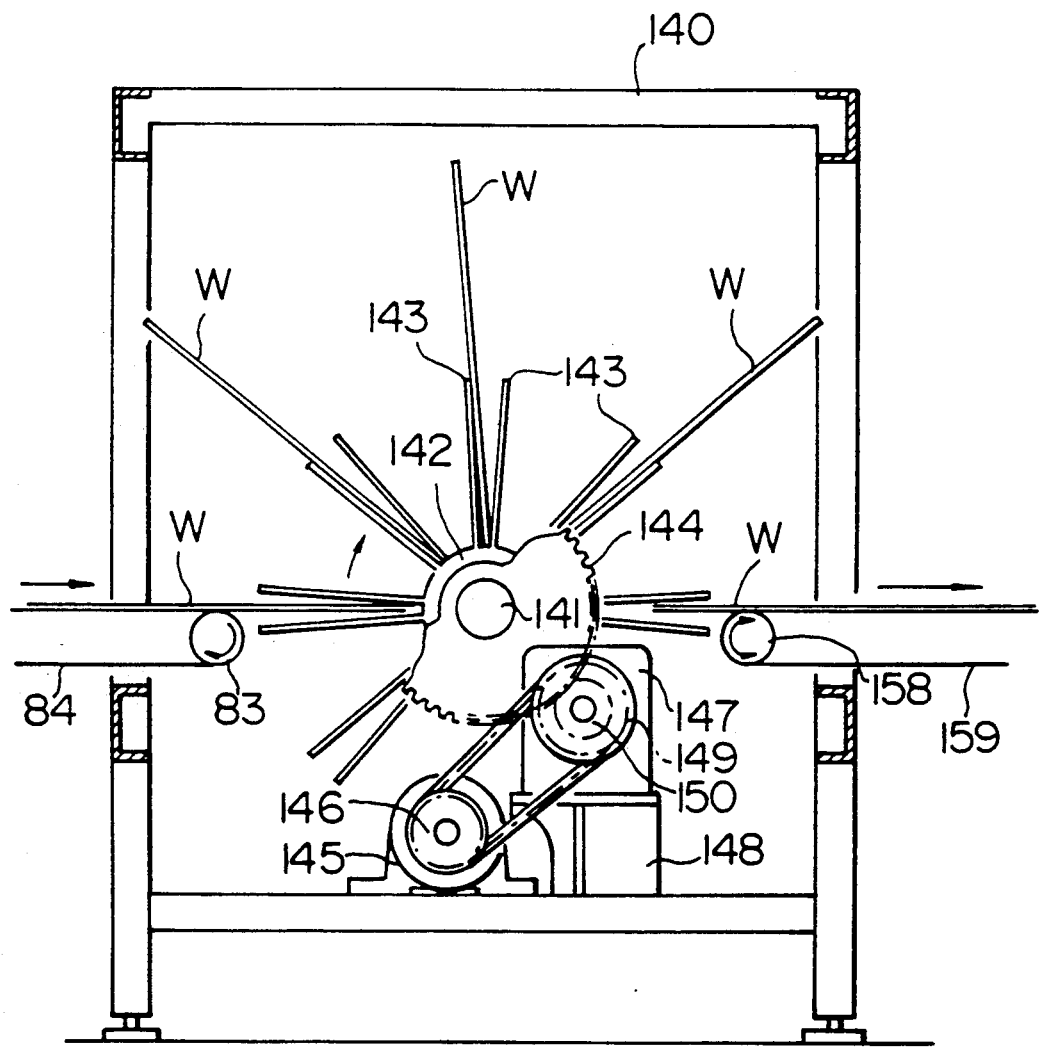
FIG. 12 is a partial front sectional view of a reversing device.

The reversing means E is shown in FIG. 12.

In the same drawing, reference numeral 140 denotes a frame; reference numeral 141 denotes a rotational shaft rotationally supported by the frame 140; reference numeral 142 denotes a drum fixed to the rotational shaft 141; reference numeral 143 denotes receiving plates fixed to the drum 142 at predetermined distances; reference numeral 144 denotes a gear fixed to the rotational shaft 141; reference numeral 145 denotes a motor fixed to the frame 140, a sprocket 146 being fixed to the rotational shaft thereof; reference numeral 147 denotes a dividing member fixed to the frame 140 through a bracket 148, a sprocket 149 being fixed to the input shaft of the dividing means 147 and a gear 150, which engages with the gear 144 being fixed to the output shaft thereof; and reference numeral 151 denotes a chain placed over the sprockets 146 and 149.

In this arrangement, when the workpiece W carried by the belts 84 of the carriage unit D1 is inserted into the receiving plates 143, the motor 145 is operated so as to actuate the dividing member 47 through the sprocket 146, the chain 151 and the sprocket 149. The gear 150 is then rotated so as to rotate the gear 144 and the rotational shaft 141, whereby the drum 142 is rotated with a pitch.

In this way, when the drum 142 is rotated through 180 degrees, the workpiece W is reversed.

Figure 13:
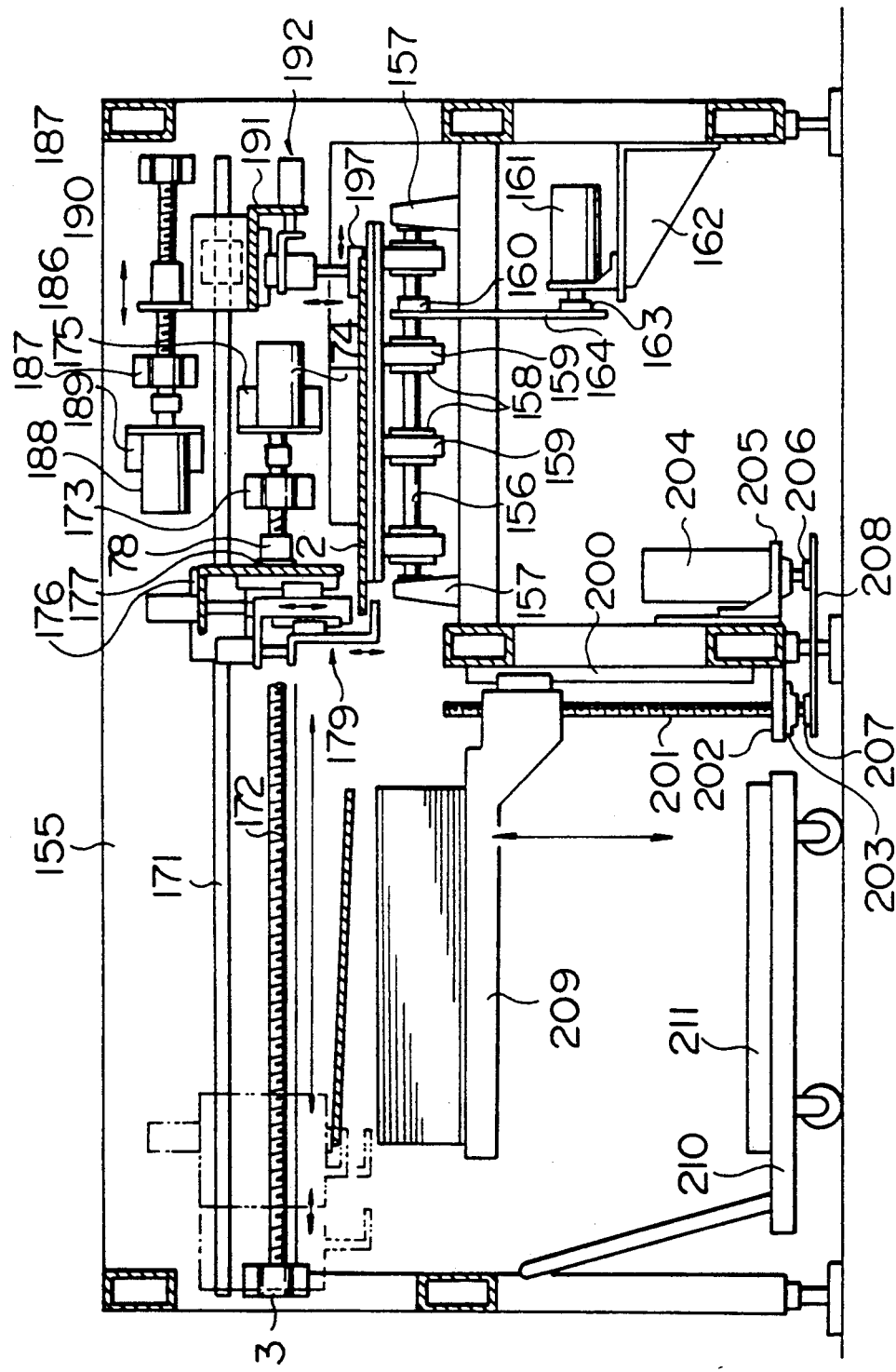
FIG. 13 is a side sectional view of a lower plate discharging device.
Figure 14:
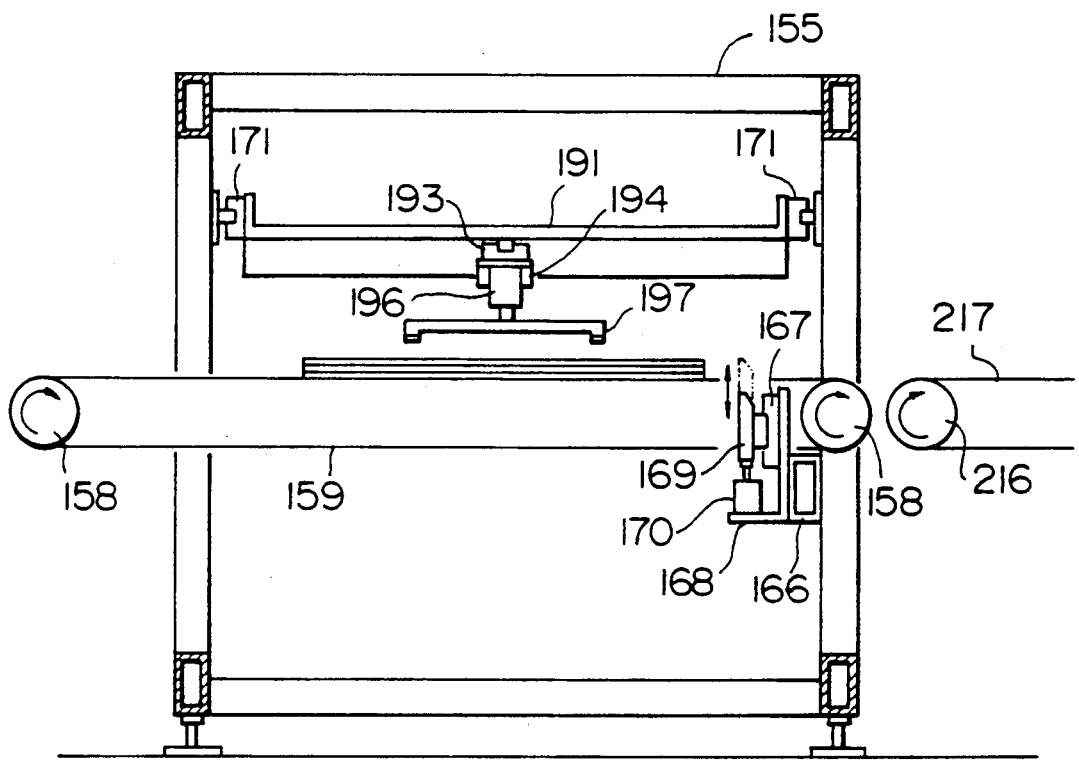
FIG. 14 is a front sectional view of the device shown in FIG. 13.

The lower plate discharging apparatus F comprises a carriage unit F1 for carrying the workpiece W, a stop unit F2 for stopping the workpiece W at a predetermined position, and a discharge unit F3 for discharging the lower plate 2, as shown in FIGS. 13 and 14.

The carriage unit F1 is shown in FIG. 13.

In the same drawing, reference numeral 155 denotes a frame; reference numeral 156 denotes a rotational shaft rotatably supported by the frame 155 through bearings 157; reference numeral 158 denotes pulleys fixed to the rotational shaft 156; reference numeral 159 being belts respectively placed over the pulleys 158; reference numeral 160 denotes a sprocket fixed to the rotational shaft 156; reference numeral 161 being a motor supported by the frame 155 through a bracket 162; reference numeral 163 being a sprocket fixed to the rotational shaft of the motor 161; and reference numeral 164 denotes a chain placed over the sprockets 160 and 163.

In this arrangement, when the motor 161 is operated, the rotational shaft 156 is rotated through the sprocket 163, the chain 164 and the sprocket 160 so as to drive the belts 159. When the, workpiece W, which is reversed by the reversing unit E, is placed on the belts 159, the workpiece W is carried in the running direction of the belts 159.

The stop unit F2 is shown in FIG. 14.

In the same drawing. reference numeral 166 denotes a beam fixed to the frame 155; reference numeral 167 denotes a guide supported by the beam 166 through a bracket 168; reference numeral 169 denotes a stopper fixed to the movable member of the guide 167; and reference numeral 170 denotes a cylinder fixed to the bracket 168, the movable member of the cylinder 170 being connected to the stopper 169.

In this arrangement, when the workpiece W, which is reversed by the reversing unit E with the lower plate 2 being on the upper side of the printed boards P, is transferred to the carriage unit F1, the cylinder 170 is operated so that the stopper 169 is projected into the carriage passage of the workpiece W. When the workpiece W is then stopped by contact with the stopper 169, and when the belts 159 are stopped, the cylinder 170 is operated so as to retract the stopper from the carriage passage of the workpiece W.

The discharge unit F3 is shown in FIG. 13.

In the same drawing, reference numeral 171 denotes a guide supported by the frame 155 in the direction vertical to the carriage direction of the workpiece W; reference numeral 172 denotes a feed screw rotatably supported by the frame 155 through a bearing 173; reference numeral 174 being a motor fixed to the frame 155 through a bracket 175, the rotational shaft thereof being fixed to the feed screw 172; reference numeral 176 denotes a movable beam fixed to the movable member of the guide 171 and connected to a nut 178 which engages with the feed screw 172 through a bracket 177; and reference numeral 179 denotes a chuck supported by the movable beam 176.

Figure 15:
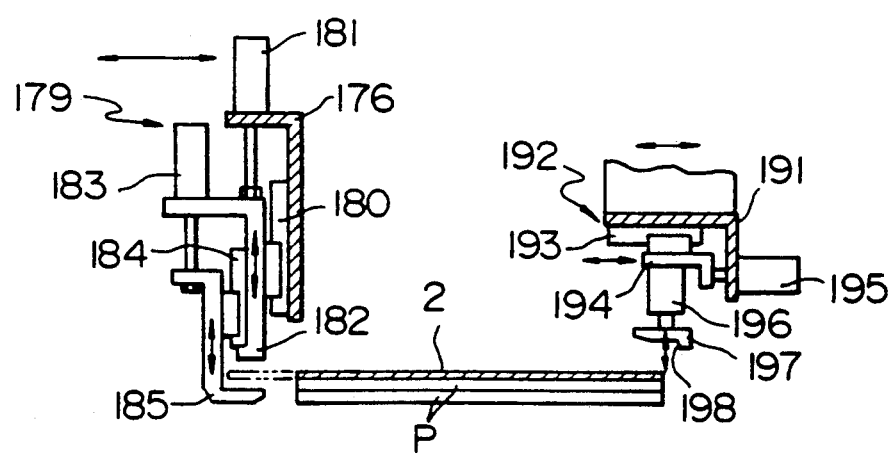
FIG. 15 is a partial sectional side view of a chuck and a pusher of the lower plate discharging device.

The chuck 179 is shown in FIG. 15.

In the same drawing, reference numeral 180 denotes a guide fixed to the movable beam 176; reference numeral 181 denotes a cylinder fixed to the movable beam 176; reference numeral 182 denotes a clamper fixed to the movable member of the guide 180 and connected to the movable member of the cylinder 181; reference numeral 183 denotes a cylinder fixed to the clamper 182; reference numeral 184 denotes a guide fixed to the clamper 182; and reference numeral 185 denotes a clamper fixed to the movable member of the guide 184 and connected to the movable member of the cylinder 183.

In this arrangement, the chuck 179 is opened and closed by the clamper 185 which is operated by the cylinder 183. The clamper 182 is positioned by the operation of the cylinder 181. In this way, the clamper 182 is positioned, and the chuck 179 is opened and closed so that an object e.g. (the lower plate 2) can be held and released.

Reference numeral 186 denotes a feed screw rotatably supported by the frame 155 through bearings 187; reference numeral 188 denotes a motor fixed to the frame 155 through a bracket 189; reference numeral 190 being a nut engaging with the feed screw 186 and connected to the movable member of the guide means 171; reference numeral 191 denotes a movable beam fixed to the same movable member as that connected to the nut 190; and reference numberal 192 denotes a pusher supported by The pusher 192 is also shown in FIG. 15.

In the same drawing, reference numeral 193 denotes a guide fixed to the movable beam 191; reference numeral 194 denotes a slider fixed to the movable member of the guide 193; reference numeral 195 denotes a cylinder fixed to the movable beam 191, the movable member thereof being connected to the slider 194; reference numeral 196 denotes a cylinder fixed to the slider 194; and reference numeral 197 denotes a hook fixed to the movable member of the cylinder 196 and having a step 198 formed in the lower surface thereof and having a height smaller than the thickness of the lower plate.

In this arrangement, when the workpiece W is stopped at a predetermined position, the motor 188 is operated to rotate the feed screw 186 and to move the movable beam 191 to a predetermined position corresponding to the size of the printed circuit boards P.

The cylinder 196 is then operated to downwardly move the hook 197. When the hook 197 contacts the lower plate 2, the cylinder 195 is operated to move the hook 197 toward the chuck 179. The lower plate 2 is consequently pushed at one end thereof by the hook 197 and inserted into the clampers 182 and 185 of the chuck 179.

In this state, when the chuck 179 holds the lower plate 2, the hook 197 is separated from the lower plate 2 by the operation of the cylinders 195 and 196 and then returned to the stand-by position by the rotation of the motor 188.

In this arrangement, when the workpiece W is stopped at a predetermined position, the motor 188 is operated to move the hook 197 to a position above the workpiece W. The cylinder 196 is then operated to bring the hook 197 into contact with the lower plate 2. When the cylinder 195 is operated to push the lower plate 2 toward the chuck 179, the lower plate 2 is inserted between the clampers 182 and 185. The cylinder 183 is then operated to upwardly move the clamper 185 in order to hold the lower plate 2 between the clampers 182 and 185. The hook 197 is then separated from the lower plate 2 by the operation of the cylinders 195 and 196 and returned to the stand-by state.

When the feed screw 172 is rotated by the operation of the motor 174, the chuck 179 is moved to the position where the lower plate 2 is discharged. When the lower plate 2 is released by the operation of the cylinder 183, the motor 174 is reversed to reverse the feed screw 172, whereby the chuck 179 is moved to a position where the lower plate 2 is delivered and waits for the discharge of the next lower plate 2.

Reference numeral 200 denotes a guide fixed to the frame 155; reference numeral 201 denotes a feed screw rotatably supported by a bearing 203 fixed to the frame 155 through a bracket 220; reference numeral 204 denotes a motor fixed to the frame 155 through a bracket 205; reference numeral 206 denotes a sprocket fixed to the rotational shaft of the motor 204; reference numeral 207 denotes a sprocket fixed to one end of the feed screw 201; reference numeral 208 denotes a chain placed over the sprockets 206 and 207; reference numeral 209 denotes a lifter having a nut engaging with the feed screw 201 and fixed to the movable member of the guide means 200; and reference numeral 210 denotes a truck to which a lower plate receiving plate 211 is fixed.

In this arrangement, when the motor is operated, the feed screw 201 is rotated through the sprocket 206, the chain 208 and the sprocket 207 so that the lifter 209 can be vertically moved. The lifter 209 is moved in correspondence with the number of the lower plates 2 discharged. When the lifter 209 reaches the lower end, the lower plates 2 on the lifter 209 are transferred to the truck 210.

The printed circuit board recovering apparatus G comprises a carriage unit G1 for carrying the printed circuit boards P, a discharge unit G2 for receiving the printed circuit boards P from the carriage unit G1 and discharging them, and a recovery unit G3 for receiving the printed circuit boards P discharged, as shown in FIGS. 16 to 19.

Figure 16:
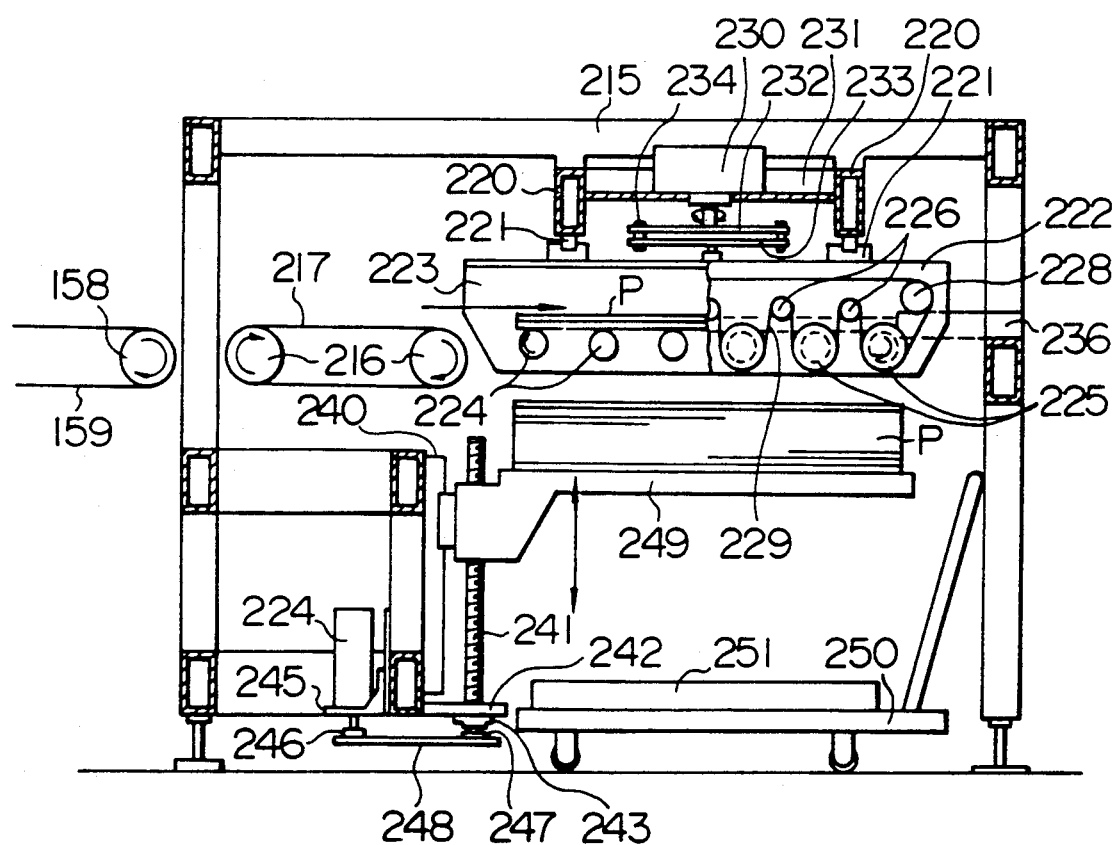
FIG. 16 is a partially sectional front view of a printed circuit board recovering device.

Since the carriage unit G1 is arranged in the same way as the carriage unit F1 of the lower plate discharging unit F, the arrangement thereof is schematically shown in the drawings. In FIG. 16, reference numeral 215 denotes a frame; reference numeral 216 denotes pulleys rotatably supported by the frame 215 and driven by a motor (not shown); and reference numeral 217 denotes a belt placed over the pulleys 216.

The printed circuit boards P sent on the belts 217 are carried by the carriage unit G1.

Figure 17:
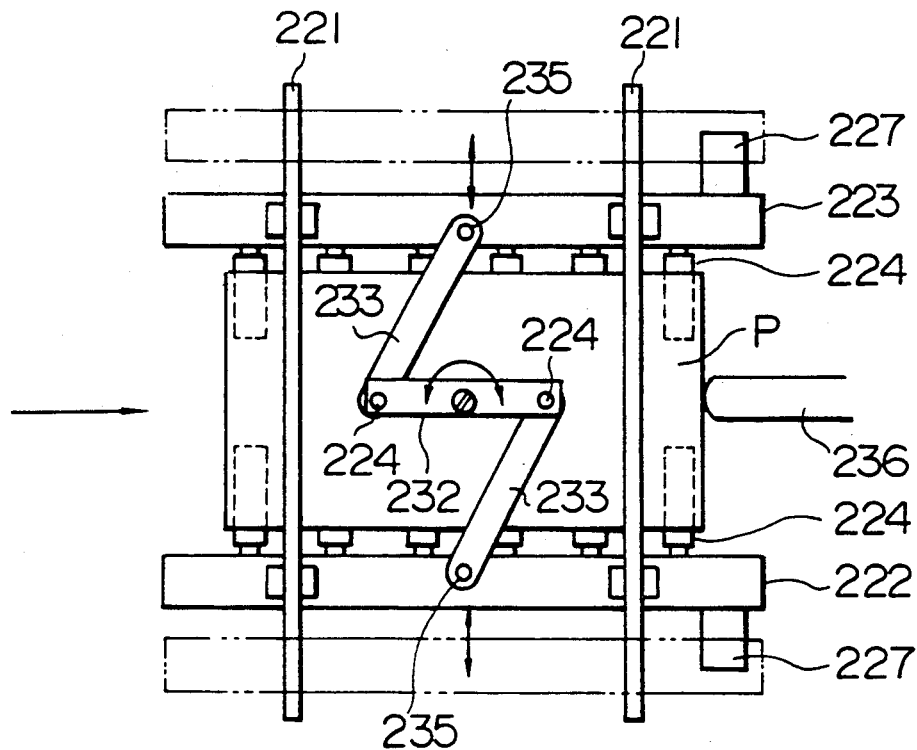
FIG. 17 is a plan view of the means shown in FIG. 16.
Figure 18:
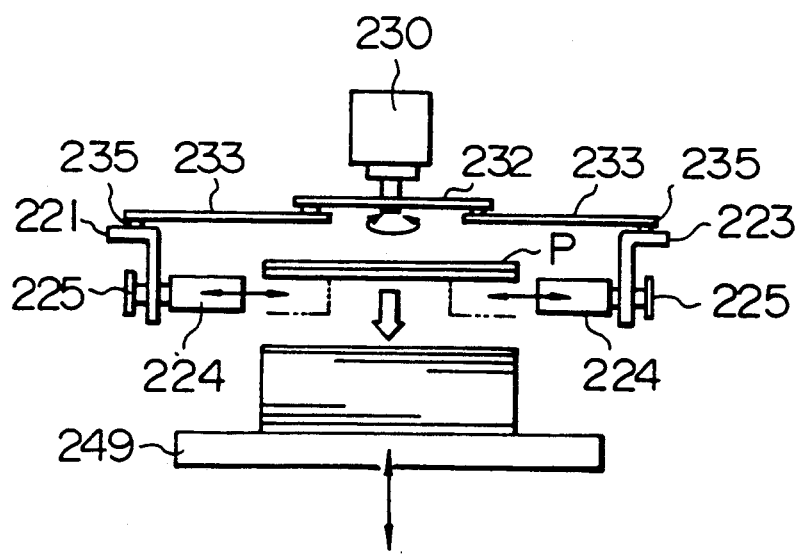
FIG. 18 is a side view of the device shown in FIG. 16.

The discharge unit G2 is shown in FIGS. 16 to 18.

In the same drawings, reference numeral 220 denotes beams respectively fixed to the frame 215; reference numeral 221 denotes guides respectively supported by the beams 220; reference numerals 222 and 223 denotes brackets respectively fixed to the movable members of the guides 221 so as to be opposite to each other; reference numeral 224 denotes rollers respectively rotatably suported by the brackets 222 and 223; reference numeral 225 denotes sprockets respectively fixed to ends of the rollers 223; reference numeral 226 denotes sprockets respectively rotatably supported by the brackets 222 and 223; reference numeral 227 denotes motors respectively fixed to the brackets 222 and 223; reference numeral 228 denotes sprockets respectively fixed to the rotational shafts of the motors 227; and reference numeral 229 denotes a chain placed over the sprockets 225, 226 and 228.

In this arrangement, when the motors 227 are operated, the rollers 224 are rotated so that the printed circuit boards P sent to the rollers from the carriage unit G1 are carried by the rotation of the rollers.

Reference numeral 230 denotes a cylinder fixed to the beams 220 through a bracket 231; reference numeral 232 denotes a clamper fixed to the rotational shaft of the cylinder 230; reference numeral 233 denotes links ends of which are respectively rotatably connected to the ends of the clamper 232 by pins 234; and reference numeral 235 denotes pins for respectively rotatably connecting the free ends of the links 233 to the brackets 222.

In this arrangement, when the cylinder 230 is operated, the clamper 232 is rotated so that the bracket 222 is moved along the guides 221,through the links 233. The movement of the bracket 222 changes the distance between the respective rollers 224 and the falling of the printed circuit boards P supported by the rollers 224.

Reference numeral 236 denotes a stopper fixed to the frame 215.

Figure 19:
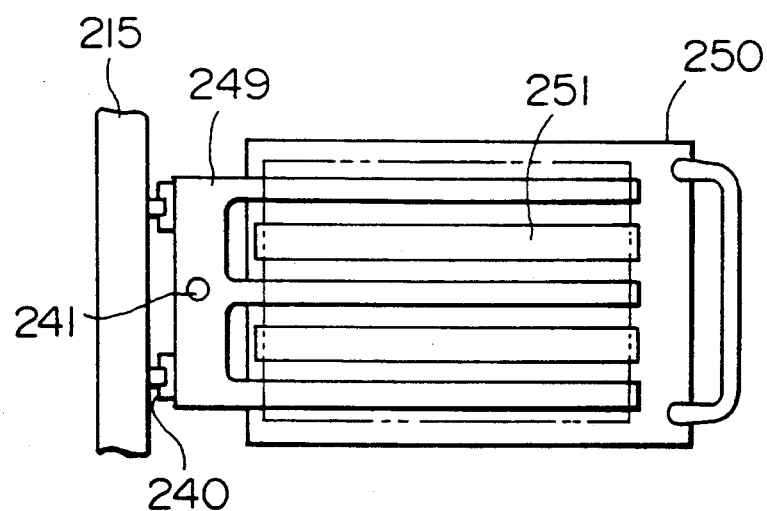
FIG. 19 is a plan view showing a relationship between a lifter and a truck.

The recovery unit G3 is shown in FIGS. 16 and 19.

In the same drawings, reference numeral 240 denotes guides fixed to the frame 215; reference numeral 241 denotes a feed screw rotatably supported by a bearing 243 fixed to the frame 215 through a bracket 242; reference numeral 244 denotes a motor fixed to the frame 215 through a bracket 245; reference numeral 246 denotes a sprocket fixed to the rotational shaft of the motor 244; reference numeral 247 denotes a sprocket fixed to one end of the feed screw 241; reference numeral 248 denotes a chain placed over the sprockets 246 and 247; and reference numeral 249 denotes a lifter fixed to the movable member of the guides 240 and having a nut engaging the feed screw 240, the lifter 249 being formed into a comb-like shape, as shown in FIG. 19.

Reference numeral 250 denotes a truck to which the printed circuit board cradle 251 is fixed.

In this arrangement, when the motor 244 is operated, the feed screw 241 is rotated through the sprocket 246, the chain 248 and the sprocket 247 so that the lifter 249 can be vertically moved. The lifter 249 is moved in correspondence with the number of the printed circuit boards P discharged, and the printed circuit boards P on the lifter 249 are transferred to the truck 250 when the lifter 249 reaches the lower end.

In the above arrangement, the workpiece W discharged from the perforator A to the conveyor 35 is carried toward the belts 15 by the operation of the motor 17. The workpiece W is then carried toward the pin extracting apparatus means B by the belts 15.

When the reference pins 3 of the workpiece W, which is carried by the belts 115, contact with the V-shaped groove of the block 24, the cylinder 27 is operated to rotate the clamper 25 which presses the reference pins 3 on the block 24 in order to position the pins 3.

When the reference pins 3 of the workpiece W are completely positioned by the positioning unit B2, the cylinder 32 is operated to downwardly move the rod which pushes the reference pins 3 out of the workpiece W. When the reference pins 3 are extracted from the workpiece W, the cylinder 27 is operated to rotate the clamper 25 and to move it to the stand-by position. The reference pins 3 extracted from the workpiece W are passed through the pipe 28 and recovered by the container box 29.

At the same time, when the cylinder 73 of the tape separating unit C is operated to move the slider 62 toward the workpiece W, the slider 65, the cam 66 and the rocking arm 69 are moved toward the workpiece W. When they are move for a distance (, the cam 66 contacts the frame 55 and is stopped thereby. At this time, since the slider 65 and the rocking arm 66 are further moved, the position of engagement between the roller 72 and the cam 66 is moved so that the rocking arm 69 rocks and presses the knife 71 on the lower plate 2 of the workpiece W. When the knife 71 is then moved for a distance L, the cylinder 73 is operated in the reverse direction. As a result, the slider 65 and the rocking arm 69 are moved toward the cylinder 73. The knife 71 rubs on the lower plate 2 so that the tapes 4 can be separated from the lower plate 2.

At the same time, the cam 66 is pushed by the roller 72 and moved toward the cylinder 73. When the cam 66 is moved for a distance (, the cam 66 contacts the frame 55 and is stopped thereby. When the slider 65 and the rocking arm 69 are moved toward the cylinder 73, the position of engagement between the roller 73 and the cam 66 is moved so that the rocking arm 69 rocks and moves the knife 71 to a position where the knife 71 does not contact the lower plate 2.

The tapes 4 are separated from the lower plate 2 by repeating several times the above-described operation.

When the motor 17 is then operated to move the workpiece W toward the upper plate discharging unit D, the reference pins 3 projecting erectly from the workpiece W contact the V-shaped groove of the block 24.

As a result, the cylinder 27 is again operated to rotate the clamper 25 which thus presses the reference pins 3 on the block 24 in order to position the pins 3. The cylinder 32 is then operated to downwardly move the rod 33 and push the reference pins 3 out of the workpiece W.

At the same time, when the cylinder 44 is operated, the tape separating unit C2 is moved to a position corresponding to the tapes 4 remaining at the rear end of the workpiece W. The tapes 4 are separated from the lower plate 2 by repeating the same operation as that described above.

When the rod 33 is then upwardly moved by the operation of the cylinder 32, the motor 17 is operated to move the workpiece W toward the upper plate discharging unit D. When the clamper 25 is moved to the stand-by position by the operation of the cylinder 27, the reference pins 3 are passed through the pipe 28 and then recovered in the container box 29.

In this way, when the reference pins 3 are extracted and when the workpiece W, in which the tapes are separated from the lower plate 2, is sent to the belts 84 driven by the motor 86 from the belts 15, the stopper 93 is projected into the carriage passage of the workpiece W by the operation of the cylinder 94. When the workpiece W contacts the stopper 93 and stopped thereby, the motor 86 is stopped to return the stopper 93 to the stand-by position.

The suction pad 122 is then made to communicate with the vacuum supply source, and the cylinder 119 is operated to press the suction pad 122 against the upper plate 1. At the same time, compressed air is blown off out of the nozzle 123.

In this state, when the cylinder 119 is operated in the reverse direction so as to upwardly move the suction pad 122, the upper plate 1 is separated from the printed circuit boards P. During this step, the blowing of compressed air prevents the printed circuit boards P from rising due to a negative pressure, which occurs between the upper plate 1 and the printed circuit boards when the upper plate 1 is upwardly moved.

When the motor 114 is then operated to rotate the feed screw 112 and to move the suction pad 122 to the predetermined position, the upper plate 1 is inserted between the fingers 107 of the chuck 103. The cylinder 105 is then operated so that the fingers 107 are closed for holding the upper plate 1. At the same time, the inside of the suction pad 122 is communicated with the atmosphere so that the upper plate 1 is released from the suction pad 122. The motor 144 is then operated to reverse the feed screw 112 and to return the suction pad 122 to the stand-by position.

On the other hand, the feed screw 96 is rotated by the operation of the motor 98 so that the chuck 103 is moved to the position above the lifter 134 where the upper plate 1 is discharged. When the chuck 103 is opened for releasing the upper plate 1 at the discharge position, the motor 98 is reversed to reverse the feed screw 96, thereby moving the chuck 103 to the position where the upper plate 1 is delivered. The chuck 103 waits for the discharge of the next upper plate at this position.

When the upper plate 1 is discharged from the workpiece W, the belts 84 are driven by the operation of the motor 86 so as to carry the workpiece W to the reversing apparatus E.

When the workpiece W carried by the belts 84 is inserted into the receiving plate 143 of the reversing unit E, the rotational shaft 141 is rotated by the operation of the motor 145 so as to rotate the drum 142 with a certain pitch. When the drum 142 is rotated for 180 degrees, the workpiece W is reversed and then transferred to the belts of the lower plate discharging unit F.

The belts 159 are then driven by the operation of the motor 161 so as to carry the workpiece W in the direction of running of the belts 159. At the same time, the stopper 169 is projected into the passage of the workpiece W by the operation of the cylinder 170.

When the workpiece W is stopped by contact with the stopper 169 and when the belts are stopped, the stopper 169 is retracted from the passage of the workpiece W by the operation of the cylinder 170.

When the workpiece W is stopped at the predetermined position, the hook 197 is moved to a position above the workpiece W by the operation of the motor 188. The cylinder 196 is then operated so that the hook 197 is brought into contact with the lower plate 2. When the lower plate 2 is pushed toward the chuck 179 by the operation of the cylinder 195, one end of the lower plate is inserted between the clamper 182 and the clamper 5.

The clamper 185 is then upwardly moved by the operation of the cylinder 183 of the chuck 179 so that the lower plate 2 is held between the clampers 182 and 5. The hook 197 is then separated from the lower plate by the operation of the cylinders 195 and 196.

On the other hand, the feed screw 172 is rotated by the operation of the motor 174 so as to move the chuck 179 to a position above the lifter 209 where the lower plate 2 is discharged. When the chuck 179 is opened to release the lower plate 2 at the discharge position, the feed screw 172 is reversed by the reversal of the chuck 174 so that that chuck 179 is moved to a position where the lower plate 2 is delivered and then waits for the discharge of the next lower plate.

On the other hand, when the lower plate 2 is discharged from the workpiece W, the belts 159 are driven by the operation of the motor 161 so as to send the printed circuit boards P to the printed board recovering apparatus G.

When the printed circuit boards P are then sent onto the belts 217 from the belts 159, the printed circuit boards P are carried by the belts 217 to the discharge unit G2.

When the printed circuit boards P are sent onto the belts 217, the rollers 224 are rotated by the operation of the motor 227. When the printed circuit boards P are sent onto the rollers 224 from the belts 217, the printed circuit boards P are carried by the rotation of the rollers 224 until they contact with the stopper 236. When the printed circuit boards P contact the stopper and are stopped thereby, the motor 227 is stopped.

The clamper 232 is then rotated by the operation of the cylinder 230 so as to move the brackets 222 along the guides 221 in the opposite directions through the links 233. The rollers 224 are then retracted from the lower portion of the printed circuit boards P in order to drop the printed board P on the lifter 249. When the printed boards P fall onto the lifter 249, the brackets 222 are moved by the operation of the cylinder 230 so as to approach each other and wait for the discharge of successive printed circuit boards.

The lifter 249 is downwardly moved by the operation of the motor 224 in correspondence with the number of the printed circuit boards P discharged. When the lifter 249 reaches the lower end, the printed circuit boards P on the lifter 249 are transferred to the truck 250.

As described above, the reference pins 3, the upper plate 1 and the lower plate 2 can be separated from the workpiece W discharged from the perforator A, and the printed circuit boards P can be discharged.

Although the above-described embodiment concerns a situation where the workpiece W is fixed by applying the tapes to the periphery thereof, when the workpiece W is fixed by using fixing pins, a plurality of pin extracting devices may be disposed in place of the tape separating unit C.

In addition, when no upper plate 1 is provided on the workpiece W, the upper plate discharging means B need not be provided.

As described above, the present invention enables printed circuit boards to be automatically discharged from a perforated workpiece.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. An apparatus for removal of printed circuit boards from a laminated workpiece, comprising pin extracting apparatus for extracing a plurality of pins erect on the laminated workpiece including at least one printed cicuit board and a lower plate, reversing and discharging apparatus for turning over and discharging said lower plate from said lamianted workpiece, and printed circuit board recovering apparatus for recovering said printed circuit boards.

2. An apparatus for removal of printed circuit boards from a laminated workpiece, comprising pin extracting apparatus for extracing a plurality of pins on the laminated workpiece including at least one printed board, an upper plate and a lower plate, upper plate discharging apparatus for discharging said upper plate from said workpiece, reversing apparatus for turning over said workpiece from which said upper plate has been removed; lower plate discharging apparatus for discharging said lower plate from said workpiece; and printed circuit board recovering apparatus for recovering said printed circuit boards.

3. An apparatus for removal of printed circuit boards from a laminated workpiece, comprising pin extracting apparatus for extracing a plurality of pins on a laminated workpiece including at least one printed circuit board, an upper plate and a lower plate, tape separating apparatus for separating tapes from said lower plate, said tapes being applied to a plurality of positions at the periphery of said workpiece so as to fix the workpiece; upper plate discharging apparatus for discharging said upper plate from said workpiece; reversing apparatus for reversing said workpiece from which said upper plate has been removed; lower plate discharging apparatus for discharging said lower plate from said workpiece; and printed circuit board recovering apparatus for recovering said printed circuit boards.

4. A method for automated removal of printed circuit boards from a laminated workpiece, comprising the steps of extracting a plurality of pins on the lamianted workpiece including at least one printed circuit board and a lower plate;
   reversing said workpiece to turn the workpiece over;
   discharging said lower plate from said workpiece; and
   recovering said at least one printed circuit board.

5. The method according to claim 4, wherein the workpiece further includes an upper plate, and the method further includes the step of discharging said upper plate from said workpiece between the extractign and reversing steps.

6. The method according to claim 4, wherein tape is applied to a plurality of positions at the periphery of said workpiece so as to fix the workpiece, and the method further includes the step of separating said tape from said lower plate between the extracting and reversing steps.

7. The method according to claim 6, wherein the workpiece further includes an upper plate, and the method further includes the steps of discharging said upper plate from said workpiece between the tape separating and reversing steps.

* * * * *